United States Patent
Manes et al.

(10) Patent No.: US 11,304,328 B2
(45) Date of Patent: Apr. 12, 2022

(54) DATA STORAGE RETAINER SYSTEMS, METHODS, AND DEVICES

(71) Applicant: Seagate Technology LLC, Cupertino, CA (US)

(72) Inventors: Joseph P. Manes, Arvada, CO (US); Angel Castillo de la Cruz, Pierce, CO (US)

(73) Assignee: Seagate Technology LLC, Fremont, CA (US)

(*) Notice: Subject to any disclaimer, the term of this patent is extended or adjusted under 35 U.S.C. 154(b) by 72 days.

(21) Appl. No.: 16/745,134

(22) Filed: Jan. 16, 2020

(65) Prior Publication Data

US 2021/0227714 A1     Jul. 22, 2021

(51) Int. Cl.
*H05K 7/14* (2006.01)
*G11B 33/04* (2006.01)
*H05K 5/02* (2006.01)

(52) U.S. Cl.
CPC .......... *H05K 7/1489* (2013.01); *G11B 33/04* (2013.01); *H05K 5/0221* (2013.01)

(58) Field of Classification Search
CPC ..... H05K 7/1489; H05K 5/0221; G11B 33/04
See application file for complete search history.

(56) References Cited

U.S. PATENT DOCUMENTS

| | | | |
|---|---|---|---|
| 5,212,681 A | 5/1993 | Bock et al. | |
| 5,319,519 A | 6/1994 | Sheppard et al. | |
| 5,875,521 A * | 3/1999 | Woo | G11B 33/02 16/280 |
| 6,580,604 B1 | 6/2003 | McAnally et al. | |
| 6,667,879 B2 | 12/2003 | Salinas et al. | |
| 7,190,574 B2 | 3/2007 | Muenzer et al. | |
| 7,200,003 B2 | 4/2007 | Hood et al. | |
| 7,289,317 B2 | 10/2007 | Hood et al. | |
| 7,298,624 B2 | 11/2007 | Boswell et al. | |
| 7,321,489 B2 | 1/2008 | McAlister | |
| 7,342,780 B2 | 3/2008 | Scicluna et al. | |
| 7,352,569 B2 | 4/2008 | Muenzer et al. | |
| 7,483,268 B1 | 1/2009 | King, Jr. et al. | |
| 7,864,519 B2 | 1/2011 | Lin et al. | |
| 8,256,737 B2 * | 9/2012 | Stango | G05G 25/04 248/642 |
| 8,902,579 B1 * | 12/2014 | Lalouette | G06F 1/187 361/679.37 |
| 9,042,094 B2 | 5/2015 | Williams et al. | |
| 9,426,908 B1 * | 8/2016 | Hsiao | G11B 33/124 |
| 9,629,275 B1 | 4/2017 | Beall | |
| 9,763,353 B1 | 9/2017 | Beall | |
| 9,823,714 B2 * | 11/2017 | Yang | G06F 1/187 |
| 9,851,765 B1 | 12/2017 | Schroeder et al. | |

(Continued)

*Primary Examiner* — Hung S. Bui
*Assistant Examiner* — Sagar Shrestha
(74) *Attorney, Agent, or Firm* — Faegre Drinker Biddle & Reath

(57) ABSTRACT

A system includes an enclosure with a first side wall, a second side wall, and a first wall assembly. The first wall assembly extends between the first side wall and the second side wall and includes a first shaft-holding portion, a first plurality of latch assemblies having a first latch end and a first pivot end, and a first shaft that extends within the first shaft-holding portion and that is coupled to the first plurality of latch assemblies at respective first pivot ends of the first plurality of latch assemblies.

10 Claims, 9 Drawing Sheets

(56) References Cited

U.S. PATENT DOCUMENTS

| | | |
|---|---|---|
| 9,958,912 B2 | 5/2018 | Chen et al. |
| 10,354,699 B1* | 7/2019 | Gopalakrishna ........ G06F 1/187 |
| 10,405,453 B1 | 9/2019 | Cunningham |
| 10,462,925 B1 | 10/2019 | Beall |
| 10,485,123 B1* | 11/2019 | Lin ...................... H05K 5/0295 |
| 10,517,183 B1* | 12/2019 | Huang ................ H05K 5/0221 |
| 2003/0140457 A1* | 7/2003 | Kida .................... G06F 1/1616 |
| | | 16/342 |
| 2003/0222550 A1 | 12/2003 | Boswell et al. |
| 2008/0112126 A1 | 5/2008 | Hsu |
| 2009/0230279 A1* | 9/2009 | Stango ................... G05G 25/04 |
| | | 248/682 |
| 2011/0173805 A1 | 7/2011 | Richet et al. |
| 2011/0299237 A1 | 12/2011 | Liang |
| 2012/0113853 A1 | 5/2012 | Carmon et al. |
| 2013/0129766 A1 | 5/2013 | Longacre et al. |
| 2014/0152164 A1 | 6/2014 | Tu |
| 2016/0050795 A1 | 2/2016 | Conn et al. |
| 2016/0302322 A1* | 10/2016 | Chen .................... G11B 33/124 |
| 2017/0094822 A1* | 3/2017 | Chen .................... G11B 33/128 |
| 2017/0199551 A1* | 7/2017 | Van Dijke ............ H05K 5/0221 |
| 2018/0146569 A1* | 5/2018 | Schroeder ............ G11B 33/124 |
| 2019/0075668 A1* | 3/2019 | Adrian ................. H05K 5/0221 |
| 2019/0371366 A1 | 12/2019 | Gopalakrishna et al. |

* cited by examiner

DATA STORAGE RETAINER SYSTEMS, METHODS, AND DEVICES

SUMMARY

In certain embodiments, a system includes an enclosure with a first side wall, a second side wall, and a first wall assembly. The first wall assembly extends between the first side wall and the second side wall and includes a first shaft-holding portion, a first plurality of latch assemblies having a first latch end and a first pivot end, and a first shaft that extends within the first shaft-holding portion and that is coupled to the first plurality of latch assemblies at respective first pivot ends of the first plurality of latch assemblies.

In certain embodiments, a system includes an enclosure with a first side wall, a second side wall, and a first wall assembly. The first wall assembly extends between the first side wall and the second side wall and includes a first shaft-holding portion, a first set of springs extending in a first direction, a second set of springs extending in a second direction opposite the first direction, and a first shaft that extends within the first shaft-holding portion and that is coupled to the first set of springs and the second set of springs.

In certain embodiments, a system includes an enclosure with a chassis, a first wall assembly, and a second wall assembly. The chassis includes a bottom wall, a first side wall extending from the bottom wall, and a second side wall extending from the bottom wall. The first wall assembly is spaced from the second wall assembly such that a carrier-less data storage device can be positioned therebetween. The first wall assembly is coupled to the bottom wall, extends between the first side wall and the second side wall, and includes a first shaft-holding portion, a first set of springs extending towards the second wall assembly, and a first shaft that extends within the first shaft-holding portion and that is coupled to and that extends through portions of the first set of springs. The second wall assembly is coupled to the bottom wall, extends between the first side wall and the second side wall, and includes a second shaft-holding portion, a second set of springs extending towards the first wall assembly, and a second shaft that extends within the first shaft-holding portion and that is coupled to and that extends through portions of the first set of springs.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
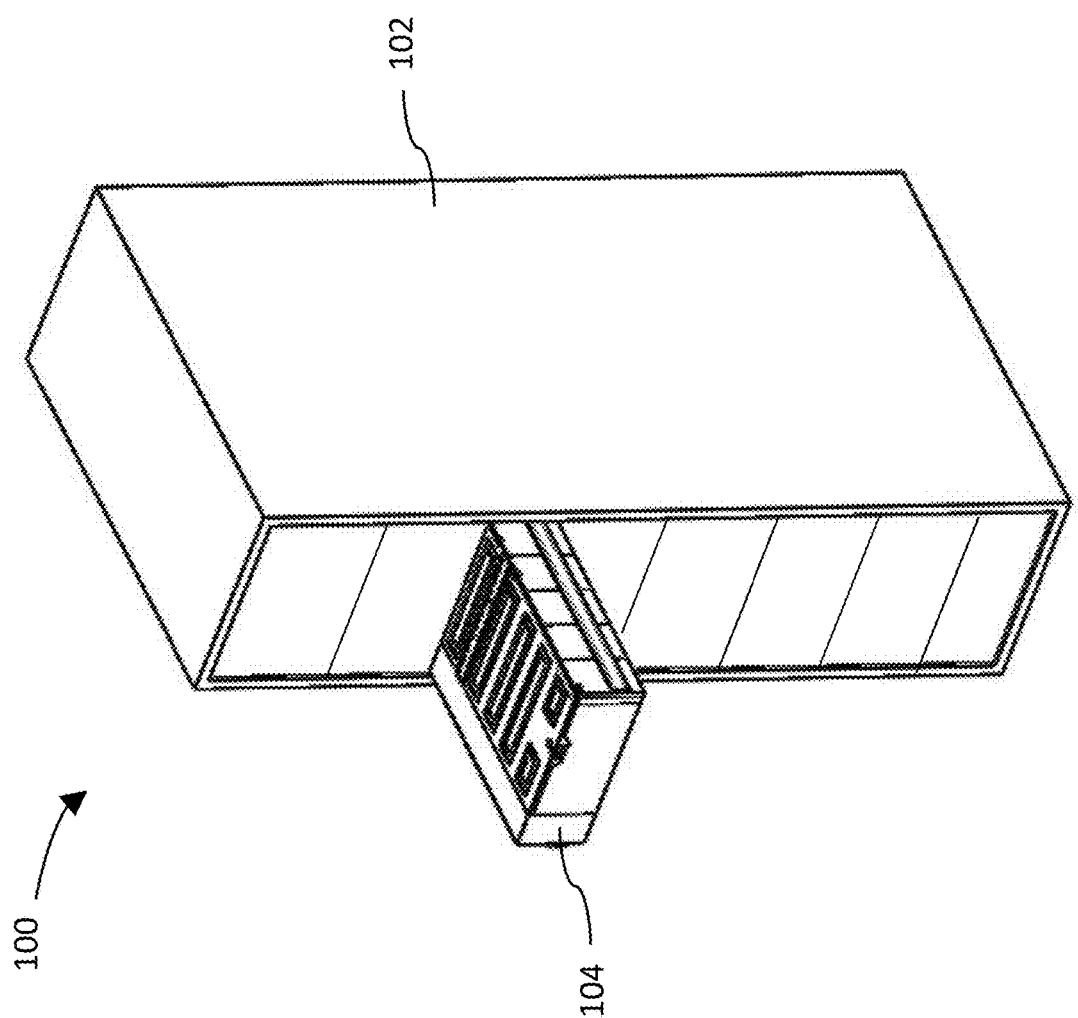
FIG. 1 shows a perspective view of a storage system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope of the appended claims.

DETAILED DESCRIPTION

Data storage systems are used to store and process vast amounts of data by incorporating many individual data storage devices such as hard disk drives and solid state drives into racks and/or enclosures of the data storage systems. Generally, each individual data storage device is first installed in a carrier, which is used to ultimately secure the data storage device into a chassis or enclosure of the data storage system. The carriers may include various features that help reduce vibration and/or make it easier to install and uninstall data storage devices to and from the data storage system. The carriers are typically designed to interface with a specific data storage system chassis. Although data storage devices such as hard disk drives have standardized sizes (e.g., form factors such as the 2.5 inch form factor and the 3.5 inch form factor), carriers have different designs because different manufacturers have different chassis designs. Having a separate carrier for each data storage device adds cost and requires more time to install, remove, and service data storage devices in data storage systems. Further, a data center may have multiple types of data storage systems, requiring multiple types of carriers which adds complexity and cost.

Certain embodiments of the present disclosure are accordingly directed to data storage systems and components thereof that do not require the use of carriers for data storage devices.

FIG. 1 shows a data storage system 100 including a rack 102 (e.g., a cabinet) with a plurality of enclosures 104. Each enclosure 104 can include multiple drawers or storage levels (each of which may be considered separate enclosures or sub-enclosures) that house electronic devices such as data storage devices installed within the drawers or storage levels. Each enclosure 104 itself can be arranged in a drawer-like fashion to slide into and out of the rack 102, although the enclosures 104 are not necessarily arranged as such.

Figure 2:
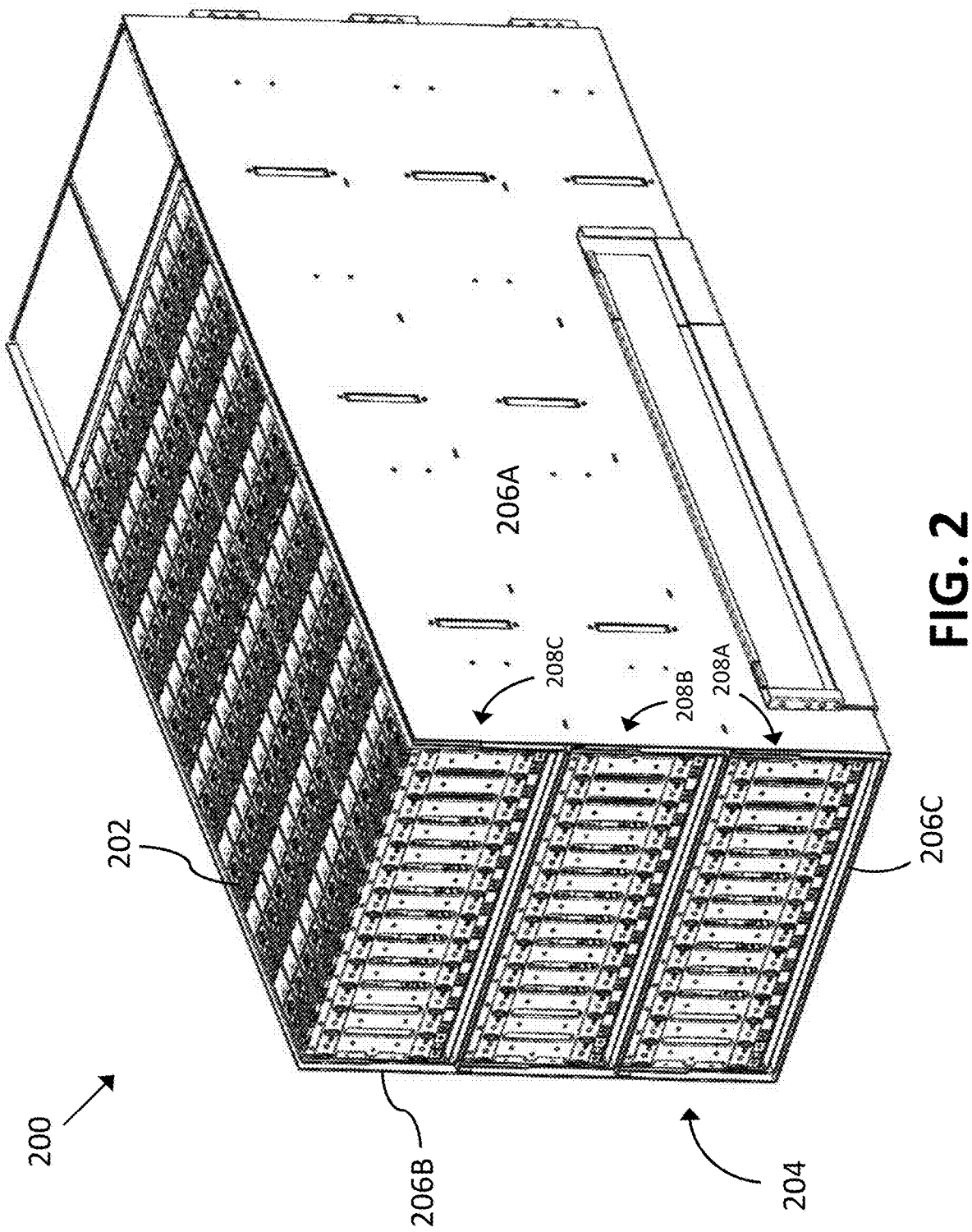
FIG. 2 shows a perspective view of an enclosure, in accordance with certain embodiments of the present disclosure.

FIG. 2 shows an enclosure 200, which can be utilized in a data storage system such as the data storage system 100 of FIG. 1. For example, a rack—such as the rack 102 in FIG. 1—can include multiple individual enclosures, such as the enclosure 200. The enclosure 200 is arranged to secure data storage devices 202 (e.g., hard disk drives and/or solid state drives), various electronics (e.g., power supplies), and cooling devices (e.g., air movers) among other things.

The enclosure 200 includes a chassis 204 with a first side wall 206A, a second side wall 206B, and a bottom wall 206C. The chassis 204 may also include front and rear walls along with a top cover to enclose the data storage devices 202 within the enclosure 200. As shown in FIG. 2, the enclosure 200 includes multiple data storage levels 208A—C each with multiple rows of data storage devices 202. Each data storage level 208A—C may be arranged to slide into and out of the enclosure 200 in a drawer-like fashion. Further, each data storage level 208A—C can form its own enclosure such that the enclosure 200 can be considered to include multiple, smaller enclosures arranged to slide into and out of the enclosure 200.

Figure 3:
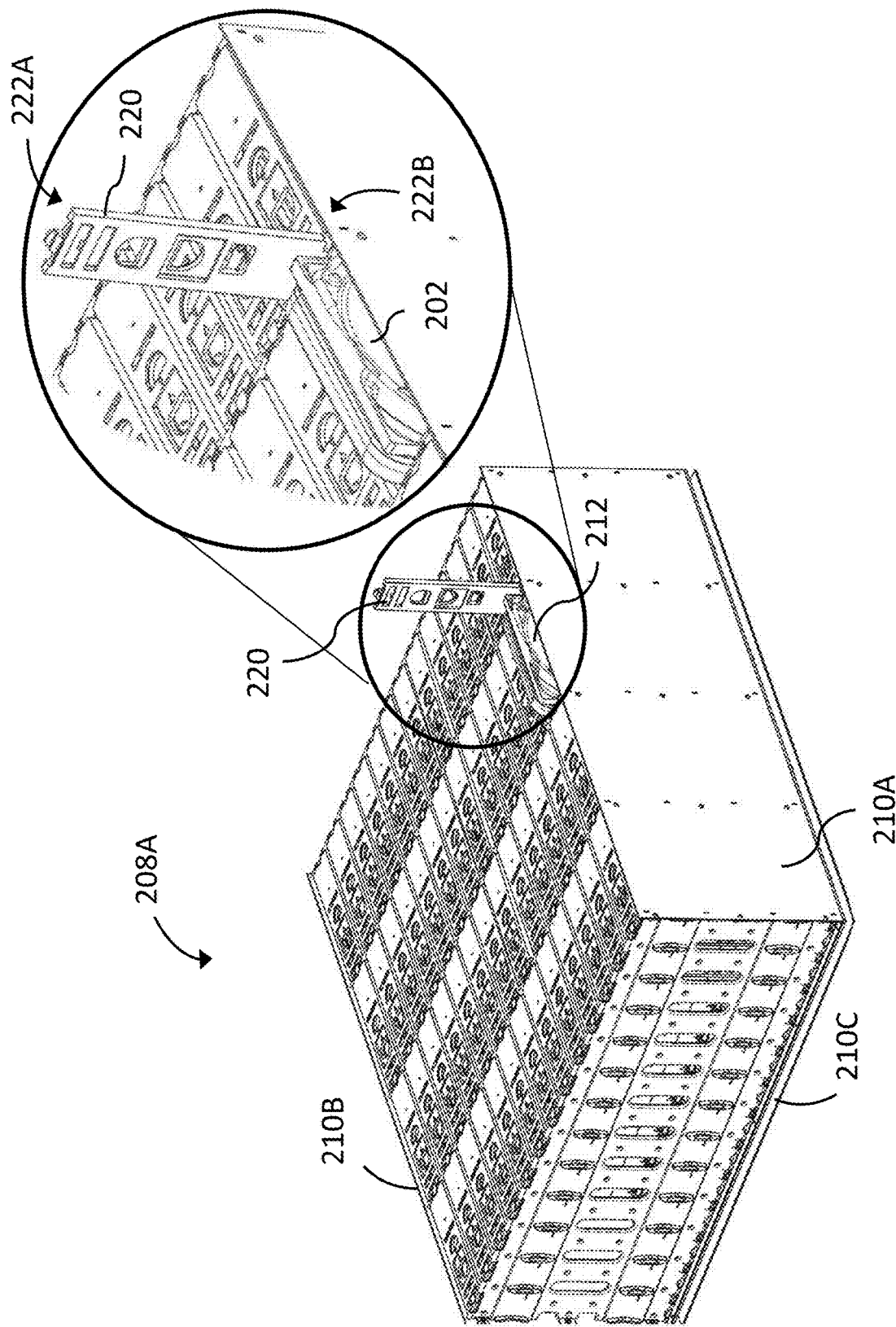
FIG. 3 shows a perspective view of a portion of the enclosure of FIG. 2, in accordance with certain embodiments of the present disclosure.
Figure 4:
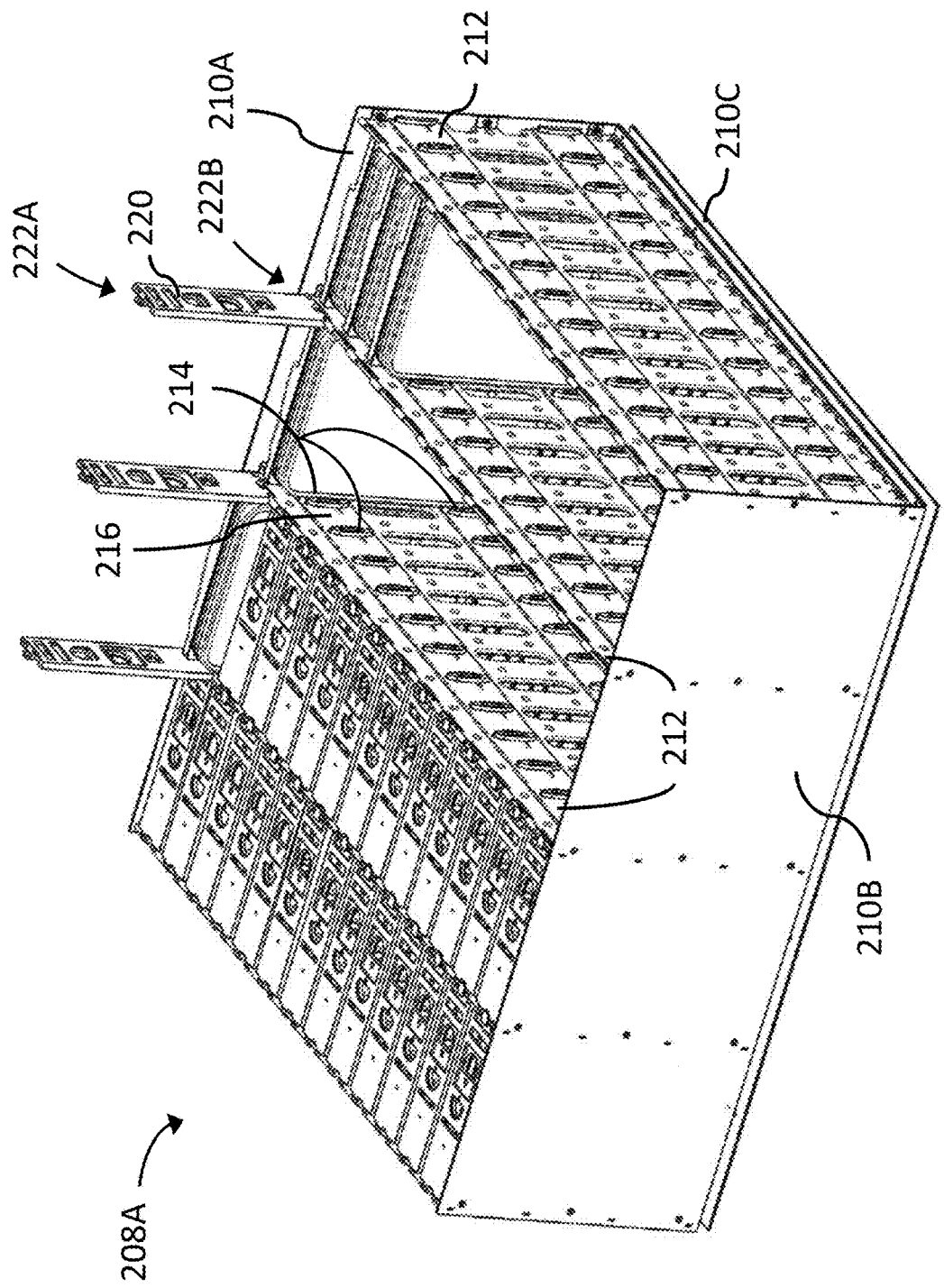
FIG. 4 shows a perspective of the enclosure of FIGS. 2 and 3 with some data storage devices removed, in accordance with certain embodiments of the present disclosure.

FIGS. 3 and 4 show portions of one of the data storage levels 208A with a first side wall 210A, a second side wall 210B, a bottom wall 210C. For simplicity of explanation, the data storage level 208A is shown with only four rows of data storage devices 202 although the data storage level 208A can include more as shown in FIG. 2.

In FIG. 4 (in which some data storage devices 202 have been removed from the data storage level 208A), the data storage level 208A is shown as including multiple wall assemblies 212 that extend laterally between the first side wall 210A and the second side wall 210B. The wall assemblies 212 are coupled to the bottom wall 210C (e.g., directly or, as described below, indirectly via a printed circuit board and spacers) and are spaced from each other such that the data storage devices 202 can be positioned therebetween in rows. The wall assemblies 212 include spacing features 214 (e.g., dampers, spacers) that help define slots 216 in which the individual data storage devices 202 are positioned. For example, the size of the slots 216 can be defined to receive one of the data storage devices 202 at a given standard form factor.

Figure 5:
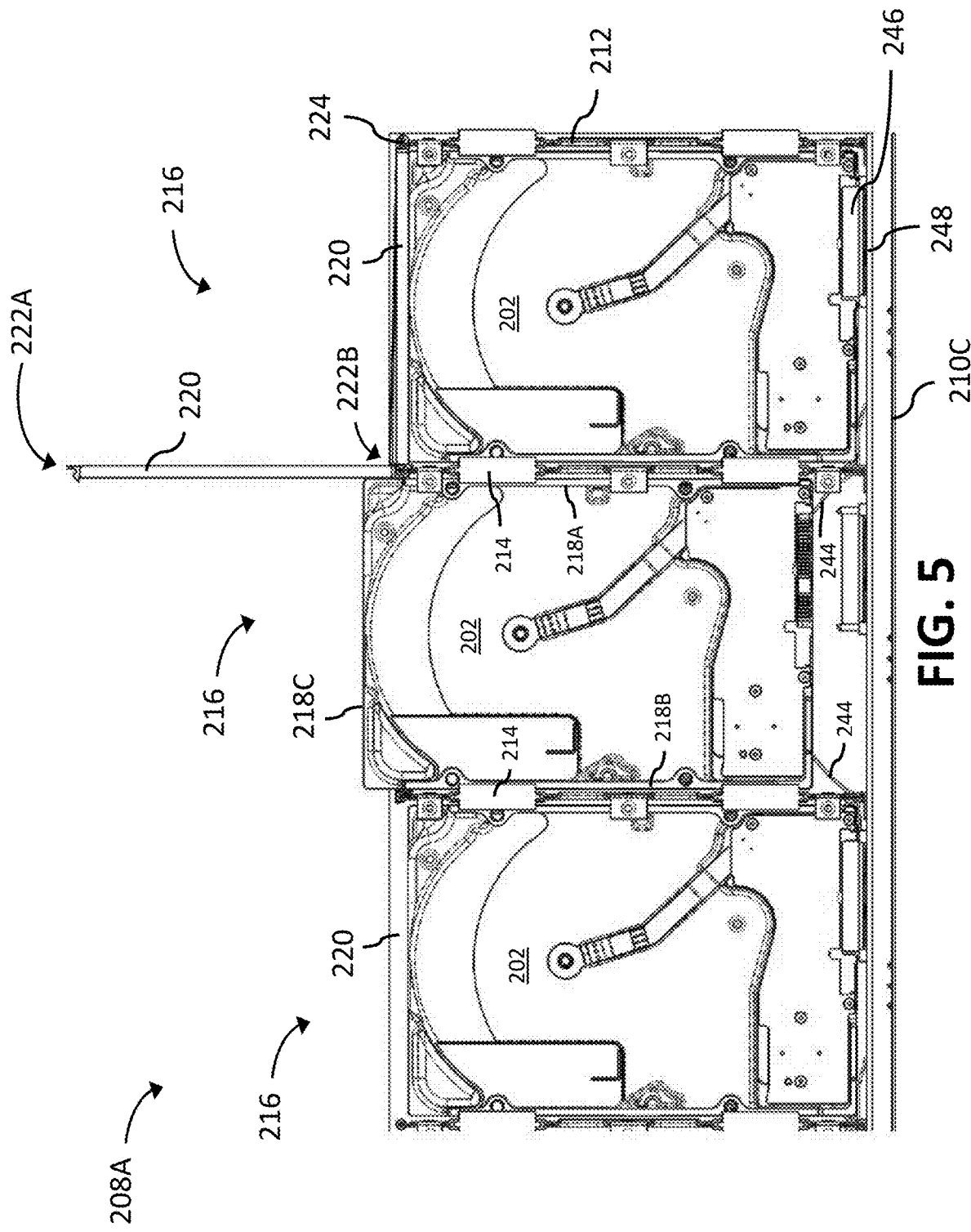
FIG. 5 shows a partial, cut-away view of a portion of the enclosure of FIGS. 2-4, in accordance with certain embodiments of the present disclosure.

FIG. 5 shows a cut away view of three of the rows of the data storage level 208A. When positioned in the slots 216, the data storage devices 202 may directly interface with or otherwise contact the wall assemblies 212. For example, at least portions of the two longitudinal sides 218A and 218B of the data storage devices 202 can directly contact components of the respective wall assemblies 212 such as the spacing features 214. In certain embodiments, the spacing features 214 comprise a material (e.g., rubber, plastic) that is softer than metal that reduces the amount of vibration that is transferred to or from the data storage devices 202 and reduces the risk of scrapping or removing metal from the exterior of the data storage devices 202. With the spacing features 214, the data storage devices 202 can be installed and removed from the slots 216 without the data storage devices 202 contacting a metal surface (e.g., the walls of the wall assemblies 212 discussed in more detail below). The data storage devices 202 may be inserted into and secured within the enclosure 200 without the use of a carrier. More specifically, there may be no components (e.g., components that are removably couplable to the data storage devices 202) between the data storage devices 202 and the wall assemblies 212. As such, the data storage devices 202 may be described as carrier-less data storage devices 202 or bare data storage devices 202.

Each slot 216 may be associated with a latch assembly 220 that helps secure one of the data storage devices 202 within the slot 216. The latch assemblies 220 can be closed such that they extend across an opening over respective slots 216 and between respective wall assemblies 212. The latch assemblies 220 are shown with a latch end 222A and a pivot end 222B.

FIG. 5 shows two data storage devices 202 (on the left and right of the page) in a secured position and one data storage device 202 (in the center of the page) in an unsecured position. In the secured position, one of the latch assemblies 220 extends over the data storage device 202 (which is positioned in one of the slots 216) in a closed position. As such, the data storage device 202 can be said to be secured in the slot 216 by the latch assembly 220 between respective wall assemblies 212. For example, the latch end 222A of the latch assembly 220 may be coupled to one wall assembly 212 while the pivot end 222B of the latch assembly 220 may be coupled to the other wall assembly 212. In certain embodiments, the latch assemblies 220 directly contact one of the sides 218C of the data storage devices 202.

In the unsecured position, the latch assemblies 220 are in an open position such that latch assemblies 220 are coupled to only one of the wall assemblies 212 at the pivot end 222B. As such, when the latch assemblies 220 are in the open position, the data storage devices 202 can be inserted into or removed from the slots 216. As will be discussed in more detail below, when the latch assemblies 220 are unlatched, ejection features help lift the data storage devices 202 at least partially out of the slots 216. FIG. 5 shows one of the data storage devices 202 in the unsecured position at least partially extending out between the wall assemblies 212 such that an operator can grasp the data storage device 202 with a tool or one of their hands.

Figure 6:
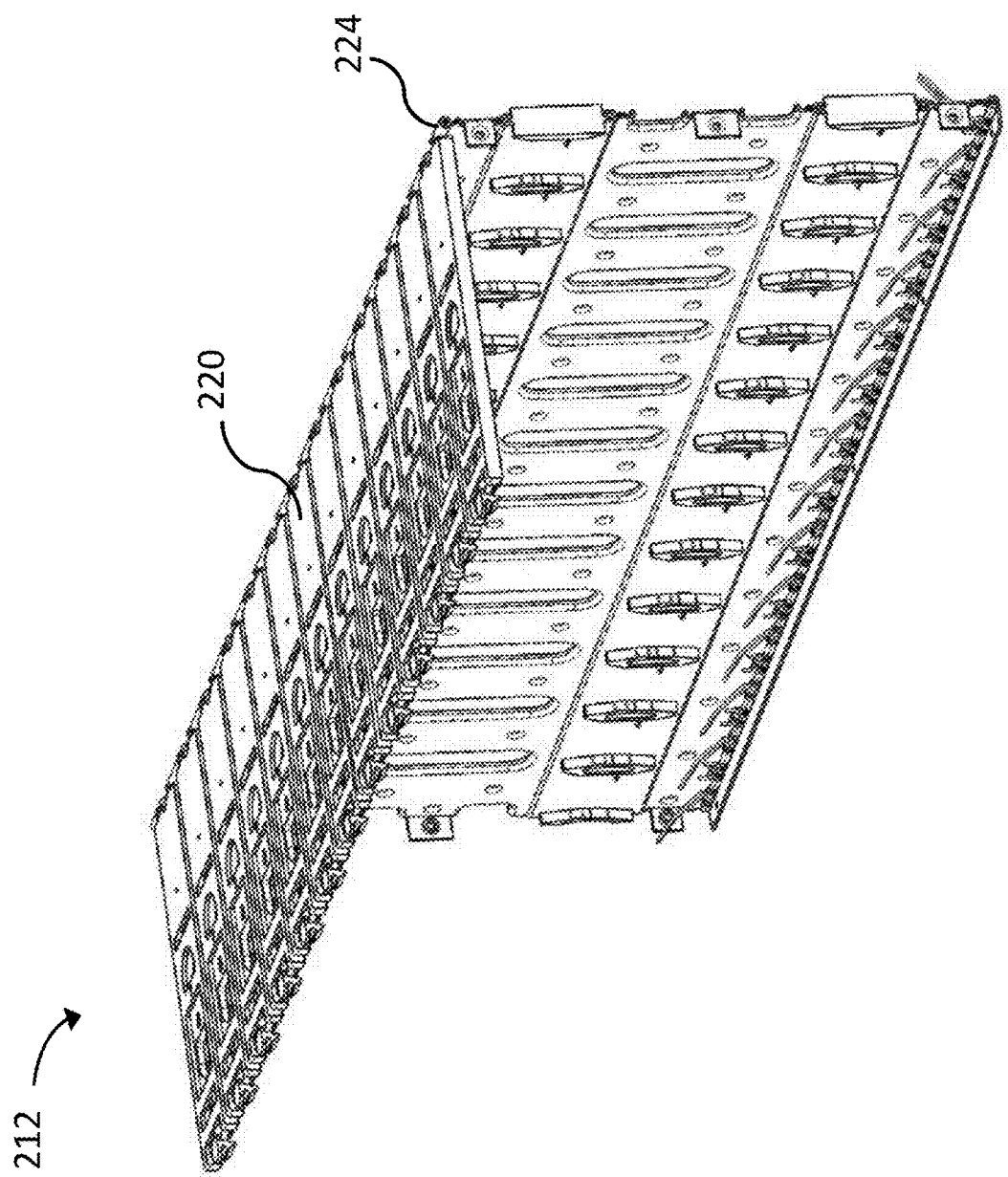
FIG. 6 shows a perspective view of a wall assembly for installation in the enclosures of FIGS. 2-5, in accordance with certain embodiments of the present disclosure.
Figure 7:
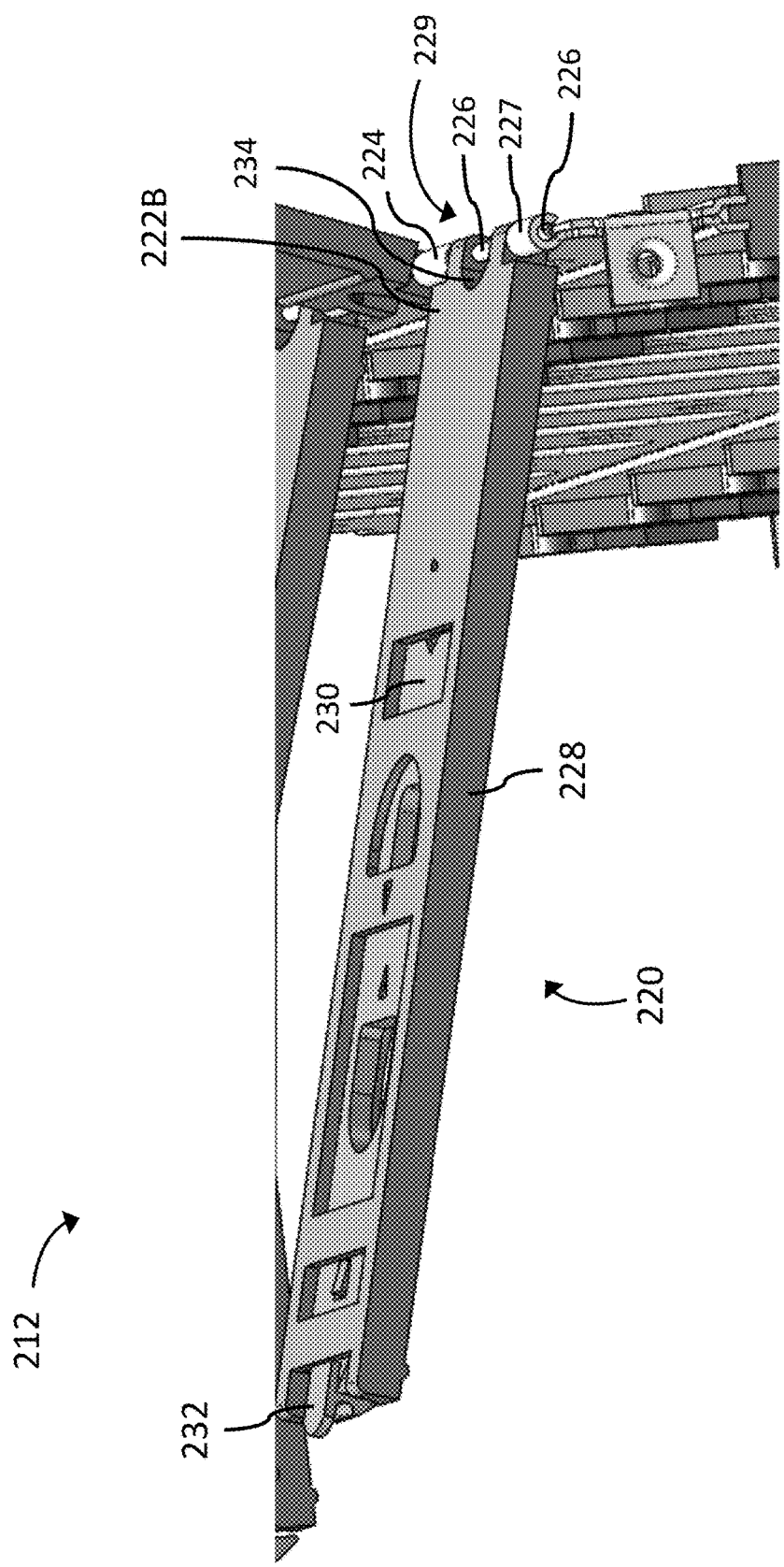
FIGS. 7 and 8 show perspective views of portions of the wall assembly of FIG. 6, in accordance with certain embodiments of the present disclosure.

FIGS. 6 and 7 show one of the wall assemblies 212. The wall assembly 212 includes a shaft-holding portion 224 with a shaft 226 (shown in FIG. 7) extending therethrough. The shaft-holding portion 224 can be shaped such that the shaft 226 maintains its position. As shown in FIG. 7, the shaft-holding portion 224 includes coupling sections 227 (e.g., curved finger-like sections) that at least partially surround and couple to the shaft 226. The shaft-holding portion 224 also includes exposed sections 229 where the shaft 226 is not covered by the coupling sections 227. As such, the latch assemblies 220 can be attached or otherwise coupled to the shaft 226 at the exposed sections 229. In certain embodiments, the shaft 226 extends through holes in the pivot ends 222B of the latch assemblies 220 such that the shaft 226 is fully surrounded by the pivot ends 222B. In other embodiments, the pivot ends 222B of the latch assemblies 220 are open-ended such that the latch assemblies 220 can be "snapped" and "unsnapped" or otherwise removably coupled to and from the shaft 226. Using either approach, the latch assemblies 220 on a given wall assembly 212 can all be coupled to a single shaft 226 such that the latch assemblies 220 can pivot around the shaft 226. It has been found that using a longer shaft or shafts for coupling to the latch assemblies 220 (rather than individual shafts for each latch assembly 220) increases the strength and stiffness of the wall assembly 212. Further, a single shaft 226 is simpler to assemble and requires fewer parts. In certain embodiments, the latch assemblies 220 include one or more stop features that stops the latch assemblies 220 from pivoting on top of an adjacent latch assembly 220. For example, the stop features may permit the latch assemblies 220 to rotate up to 110 degrees from the closed position.

As shown in FIG. 7, the latch assemblies 220 include a body 228 and a slidable portion 230. The slidable portion 230 includes coupler 232 that is shaped such that the coupler 232 can engage and directly couple to the shaft 226 of one of the wall assemblies 212. For example, the coupler 232 may include a semi-circle shaped recession that is shaped to snap onto the shaft 226. The body 228 of the latch assemblies 220 can include a recess portion 234 such that the coupler 232 of an adjacent latch assembly 220 can couple to the shaft 226 at the recess portion 234. The slidable portion 230 can include a biasing mechanism (e.g., a spring) that provides a force against the slidable portion 230 so that the slidable portion 230 remains coupled to the shaft 226 when the latch assembly 220 is in the closed position.

To release the latch assembly 220 when in the closed position, a force may be applied to the slidable portion 230 away from the shaft 226 it is coupled to so that the biasing mechanism is compressed and the coupler 232 is disengaged from the shaft 226. The latch assembly 220 can then rotate to the open position. In certain embodiments, the latch assemblies 220 can be coupled to a spring (e.g., a torsion spring) that applies a biasing force to rotate the latch assemblies 220 towards a fully open position when the latch assemblies 220 are unlatched from the shaft 226 of the adjacent latch assembly 220.

Figure 8:
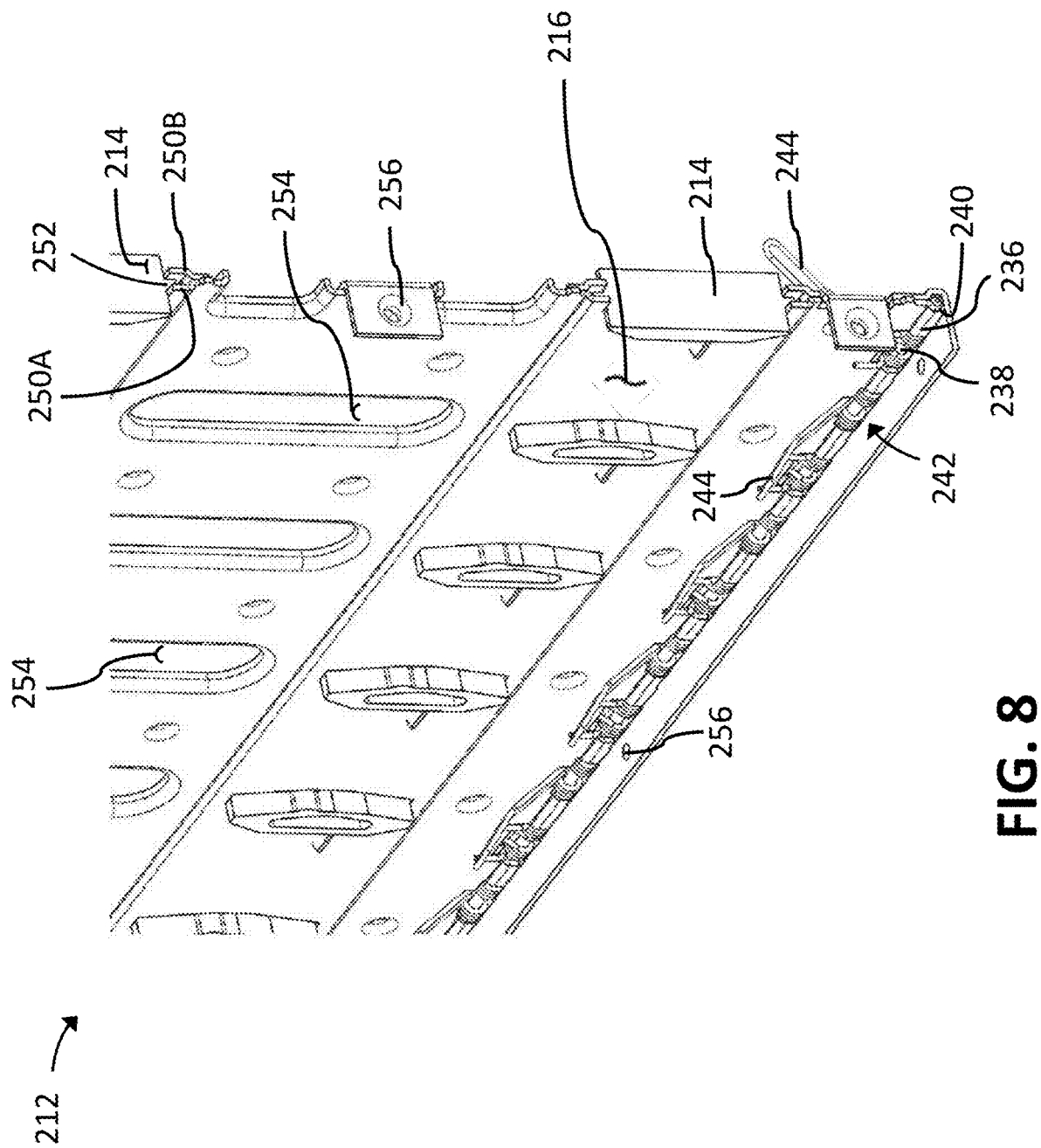
Figure 9:
FIG. 9 shows a perspective view of a spring for installation in the wall assembly of FIGS. 6-8, in accordance with certain embodiments of the present disclosure.

FIG. 8 shows a bottom portion of the wall assembly 212, which includes a bottom shaft-holding portion 236 with a shaft 238 extending therethrough. The bottom shaft-holding portion 236 can be shaped such that the shaft 238 maintains its position. As shown in FIG. 8, the bottom shaft-holding portion 236 includes coupling sections 240 (e.g., curved finger-like sections) that at least partially surround and couple to the shaft 238. The bottom shaft-holding portion 236 also includes exposed sections 242 where the shaft 238 is not covered by the coupling sections 240. Attached to the shaft 238 are springs 244 that assist with ejecting the data storage devices 202 from their respective slot 216 when the respective latch assembly 220 is in the open position. FIG. 9 shows one example of the spring 244 as a torsion spring. In certain embodiments, the shaft 238 extends through holes in the springs 244. In certain embodiments, the spring 244 is assembled to the shaft 238 such that the spring 244 is pre-loaded. For example, the spring 244 may provide a resistive force as soon as the data storage device 202 contacts the spring 244.

As shown in FIG. 8, the springs 244 on a given wall assembly 212 can all be coupled to a single shaft 238. Some of the springs 244 extend in one direction into a first set of slots 216 while the other springs 244 extend in an opposite direction into a second set of slots 216. As such, when the data storage level 208A is assembled, the springs 244 are arranged to assist in removing the data storage devices 202 located in the drive slots 216. For example, each pair of springs 244 (e.g., one spring on each side of a given slot 216) can be biased such that—when one of the latch assemblies 220 is open—the springs 244 can lift the data storage device 202 positioned in the slot 216 so that the data storage device 202 can be grabbed by an operator and removed from the enclosure 200. Each slot 216 can include two springs 244—one on each side of the slot 216. The springs 244 can provide a substantially equal force on both sides of a given data storage device 202 such that the data storage device 202 is not torqued or rotated as the data storage device 202 is ejected by the springs 244.

In certain embodiments, as shown in FIG. 5, each data storage device 202 may be coupled to an electrical connector 246. As such, the springs 244 should be biased such that the data storage device 202 is uncoupled from the electrical connector 246 without additional external force. FIG. 5 shows the middle data storage device 202 being lifted by two springs 244 on opposite sides of the slot 216.

The electrical connector 246 is connected to a printed circuit board 248, which is positioned above the bottom wall 210C of the data storage level 208A such that a gap exists between the printed circuit board 248 and the bottom wall 210C. Having a gap can make it easier for accessibility and maintenance (e.g., replacing components of the printed circuit board 248). In certain embodiments, the printed circuit board 248 is separated from the bottom wall 210C by spacers or standoffs. In certain embodiments, the printed circuit board 248 defines the bottom of the slots 216. Alternatively or additionally, in certain embodiments, the data storage levels 208A—C can include a spring (e.g., a compression spring) for each data storage device 202 that is positioned such that the spring provides a force at a center of the bottom side of the data storage device 202. For example, the spring may be coupled to the bottom wall of the data storage level 208A—C and extend through a hole in the printed circuit board 248. When a given data storage device 202 is positioned in a given slot 216, a center of the bottom side of the data storage device 202 compresses the spring. The spring is positioned to urge the data storage device 202 out of the slot 216 with little to no rotation or torque.

As shown in FIG. 8, the wall assemblies 212 also include two walls 250A and 250B (e.g., two sheets of metal) that can be coupled together (e.g., fastened, riveted). When coupled together as shown in FIG. 8, the two walls 250A and 250B can retain various features of the wall assemblies 212. For example, portions 252 of the spacing features 214 can be pressed between the walls 250A and 250B such that the spacing features 214 are retained in their position. As noted above, the spacing features 214 are positioned between data storage devices 202 to provide a space between the data storage devices 202.

As shown in FIG. 8, the wall assemblies 212 can include multiple spacing features 214 between the data storage devices 202 (e.g., two spacing features 214 between top portions of the data storage devices 202 and two other spacing features 214 between bottom portions of the data storage devices 202). The spacing features 214 may be arranged to contact datum points on the exterior of the data storage devices 202 such that the data storage devices 202 do not contact the walls 250A and 250B. In certain embodiments, each individual spacing feature 214 provide spacing, damping, etc., on both sides of the wall assembly 212 to which the spacing features 214 is attached. For example, the spacing features 214 can extend through the walls 250A and 250B of the wall assembly 212. In certain embodiments, the spacing features 214 can be tapered to guide the data storage devices 202 as they are inserted into the slots 216. Having features such as the spacing features 214 and the springs 244 on one wall assembly 212 for both sides of the wall assembly 212 saves space and material.

The walls 250A and 250B can also include openings 254 to allow air to flow through the wall assemblies 212 to cool the data storage devices 202. For example, the openings 254 can be positioned above the spacing features 214 so that air flows in the space between the data storage devices 202. Further, the openings 254 in each of the wall assemblies 212 can be generally aligned so that air can more easily flow throughout the data storage levels 208A—C.

As shown in FIG. 8, one or more of the walls 250A and 250B can include mounting openings 256. Some mounting openings 256 can be used to help fasten the wall assemblies 212 to the side walls 210A and 2108 of the data storage level 208A. For example, fasteners can extend through the mounting openings 256 to secure the wall assemblies 212 to the side walls 210A and 210B. Other mounting openings 256 can be used to help fasten the wall assemblies 212 to the printed circuit board 248. For example, the wall assemblies 212 can rest on the printed circuit board 248 and fasteners can extend through the mounting openings 256 to secure the wall assemblies 212 to the printed circuit board 248.

The features shown herein and described above help create a data storage level or enclosure in which data storage devices can be positioned without the need for a separate carrier. Further, the data storage devices can be installed and removed without needing separate tools.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A system comprising:
   an enclosure including a first side wall, a second side wall, and a first wall assembly, the first wall assembly extending between the first side wall and the second side wall and including:
   a first shaft-holding portion,
   a first set of springs extending in a first direction,
   a second set of springs extending in a second direction opposite the first direction, and
   a first shaft that extends within the first shaft-holding portion and that is coupled to the first set of springs and the second set of springs.

2. The system of claim 1, wherein the first shaft extends through portions of the first set of springs and the second set of springs.

3. The system of claim 1, wherein the first set of springs and the second set of springs are torsion springs.

4. The system of claim 1, wherein the first set of springs and the second set of springs that are torsion springs are pre-loaded.

5. A system comprising:
   an enclosure including a chassis, a first wall assembly, and a second wall assembly,
   the chassis including a bottom wall, a first side wall extending from the bottom wall, and a second side wall extending from the bottom wall,
   the first wall assembly spaced from the second wall assembly such that a carrier-less data storage device can be positioned therebetween, the first wall assembly coupled to the bottom wall, extending between the first side wall and the second side wall, and including:
   a first shaft-holding portion,
   a first set of springs extending towards the second wall assembly in a space between the first wall assembly and the second wall assembly, and
   a first shaft that extends within the first shaft-holding portion and that is coupled to and that extends through portions of the first set of springs, and
   the second wall assembly coupled to the bottom wall, extending between the first side wall and the second side wall, and including:
   a second shaft-holding portion,
   a second set of springs extending towards the first wall assembly in the space, and
   a second shaft that extends within the second shaft-holding portion and that is coupled to and that extends through portions of the second set of springs.

6. The system of claim 5, wherein the first set of springs and the second set of springs are torsion springs that are arranged to provide a substantially similar force on opposite sides of a data storage device.

7. The system of claim 5, wherein the first wall assembly and the second wall assembly include spacers that at least partially define slots, the system further comprising:
   bare data storage devices positioned within the slots with the spacers positioned between pairs of data storage devices, wherein one spring of the first set of springs extends in one of the slots, wherein one spring of the second set of springs extends in the one of the slots.

8. The system of claim 5, further comprising:
   a printed circuit board, wherein the first wall assembly and the second wall assembly are directly coupled to the printed circuit board.

9. The system of claim 5, wherein the first wall assembly includes a third shaft-holding portion on an opposite end of the first shaft-holding portion, a first plurality of latch assemblies having a first latch end and a first pivot end, and a third shaft that extends within the third shaft-holding portion and that is coupled to the first plurality of latch assemblies at respective first pivot ends of the first plurality of latch assemblies.

10. The system of claim 9, wherein the second wall assembly includes a fourth shaft-holding portion on an opposite end of the second shaft-holding portion and a second shaft that extends within the second shaft-holding portion, wherein the first latch end of the first plurality of latch assemblies are arranged to removably couple to the second shaft.

* * * * *